United States Patent [19] [11] 4,389,268
Oshima et al. [45] Jun. 21, 1983

[54] PRODUCTION OF LAMINATE FOR RECEIVING CHEMICAL PLATING

[75] Inventors: Renzo Oshima, Hachioji; Yoshiyuki Kyojima, Kawasaki; Takara Fujii; Shoji Kato, both of Yokohama, all of Japan

[73] Assignees: Tokyo Shibaura Denki Kabushiki Kaisha, Kawasaki; Toshiba Chemical Products Company, Tokyo, both of Japan

[21] Appl. No.: 285,981

[22] Filed: Jul. 23, 1981

[30] Foreign Application Priority Data

Aug. 6, 1980 [JP] Japan ............................... 55-107945
Aug. 6, 1980 [JP] Japan ............................... 55-107947

[51] Int. Cl.³ .................... C25D 5/34; B32B 31/00; B29C 17/08
[52] U.S. Cl. ............................... 156/150; 156/154; 156/272.6; 156/280; 156/629; 156/630; 156/668; 156/902; 204/30; 204/32 R; 427/40; 427/97; 427/98; 427/307

[58] Field of Search .................... 427/96–98, 427/307, 322, 40; 152/150, 154, 272.6, 278–280, 330, 331, 334, 630, 668, 643, 629, 901, 902, 307.3, 307.7; 204/15, 30, 32 R

[56] References Cited

U.S. PATENT DOCUMENTS 4,001,466  1/1977  Shaul et al. .................. 427/322 X
4,152,477  5/1979  Haruta et al. ................ 427/307 X Primary Examiner—William A. Powell
Attorney, Agent, or Firm—Oblon, Fisher, Spivak, McClelland & Maier

[57] ABSTRACT

The method of producing a laminate for receiving a chemical plating comprises the step of forming a thermosetting adhesive layer containing a butadiene-based rubber on at least one surface of a peel-resistant insulating sheet. After the adhesive layer has been cured substantially completely, the adhesive-bearing sheet is bonded to a base material so as to obtain an integral laminate, followed by coarsening the outermost surface of the laminate on the side of the insulating sheet. A laminate with a metalized surface is obtained, if a chemical plating is applied to the coarsened surface of the laminate.

24 Claims, 5 Drawing Figures

PRODUCTION OF LAMINATE FOR RECEIVING CHEMICAL PLATING

BACKGROUND OF THE INVENTION (I) Field of the Invention

This invention relates to a method of producing a laminate to the surface of which a chemical plating is to be applied, particularly, to a method of producing a laminate exhibiting a high heat resistance and permitting a chemical plating layer to be formed on the surface satisfactorily. This invention relates also to a method of producing a laminate with a metalized surface.

(II) Description of the Prior Art

In applying a chemical plating to the surface of a laminate such as a paper-phenolic resin laminate, a glass-epoxy resin laminate or a paper-epoxy resin laminate, it was customary to coarsen the laminate surface in advance by means of, for example, a honing treatment. Certainly, the coarsening treatment permits facilitating the metal deposition to the laminate surface and improving to some extent the bonding strength of the formed plating layer to the laminate. But, the laminate itself used in this field fails to exhibit a heat resistance high enough to withstand a soldering operation applied to the metalized surface of the laminate.

It was also customary to form an adhesive layer on the laminate surface. For example, a peelable sheet is coated with an adhesive containing a butadiene-based rubber as the main component. The adhesive coating, while in a semi-cured state, is brought into contact with a base material such as a pre-preg, followed by heating the coating under pressure so as to cure the coating. Then, the sheet is peeled off the cured adhesive coating and a chemical plating is applied to the exposed surface of the coating. Certainly, the plating metal is effectively deposited on and strongly bonded to the adhesive layer. But, the resin molecules contained in the base material, e.g. pre-preg, are diffused into the adhesive layer in the heating step under pressure so as to impair the intrinsic properties of the adhesive layer.

SUMMARY OF THE INVENTION

An object of this invention is to provide a method of producing a laminate exhibiting a high heat resistance and permitting a chemical plating layer to be formed on the surface satisfactorily.

Another object is to provide a method of producing a laminate with a metalized surface.

According to this invention, there is provided a method of producing a laminate to the surface of which a chemical plating is to be applied, comprising the steps of:

coating at least one surface of a non-peelable insulating sheet with a thermosetting adhesive containing a butadiene-based rubber;

curing substantially completely the adhesive coating;

laminating and cured adhesive-bearing sheet on a base material such that the adhesive coating is bonded to the base material surface; and coarsening the outermost surface of the laminate on the side of the insulating sheet.

It is important to note that the adhesive coated on an insulating sheet is cured substantially completely before the laminating step. As a result, the produced laminate is enabled to exhibit an excellent heat resistance. In addition, the resin molecules contained in the base material are prevented from being diffused into the adhesive layer. It follows that the method of this invention permits producing a satisfactory laminate with a metalized surface.

In one embodiment of this invention, both surfaces of the insulating sheet are coated with the thermosetting adhesive and the insulating sheets of this type are laminated on both surfaces of the base material. The coarsening treatment is applied to each of the exposed surfaces of the adhesive layers.

In a preferred embodiment of this invention, the coarsening treatment is also applied to the cured adhesive surface which is to be brought into direct contact with the base material. In this case, the bonding strength of the adhesive layer to the base material is improved and the produced laminate is enabled to exhibit a further improved heat resistance.

When a chemical plating is applied to the exposed coarsened surface of the laminate, the resultant metal layer does not peel off the laminate even under high temperatures.

DETAILED DESCRIPTION OF THE PREFERRED EMBODIMENTS

Figure 1A:
FIGS. 1A to 1C are cross sectional views collectively showing how to produce a laminate according to one embodiment of this invention.

In producing a laminate by the method of this invention, adhesive layers 12 and 13 are formed on both surfaces of a peel-resistant or non-peelable insulating sheet 11 as shown in FIG. 1A. Used as the sheet 11 is, for example, a heat resistant plastic sheet formed of polyester, polyimide, Nylon, etc., as well as a paper sheet, a synthetic fiber cloth or a glass cloth. On the other hand, the adhesive layers 12 and 13 are formed of a thermosetting adhesive containing a butadiene-based rubber. The term "butadiene-based rubber" represents a rubbery homopolymer or copolymer of butadiene including, for example, butadiene rubber, butadiene-nitrile rubber and styrene-butadiene rubber. The adhesive used in this invention can be formed of the butadiene-based rubber and a thermosetting resin such as epoxy resin, phenolic resin, xylene resin and melamine resin together with the butadiene-based rubber mentioned above. The thermosetting adhesive composition contains in general 20 to 70% by weight, preferably, 35 to 50% by weight, of the butadiene-based rubber.

The adhesive composition is dissolved in an organic solvent in a manner to prepare, preferably, a solution of varnish state and the insulating sheet 11 is coated with the solution by means of roll coating, curtain coating, immersion, brushing, etc. so as to form the adhesive layers 12 and 13. It is desirable to coat the solution uniformly and in a thickness permitting the adhesive layer after cured to be 20 to 100$\mu$ thick. A cured adhesive layer thinner than 20$\mu$ fails to exhibit the desired properties sufficiently.

The adhesive layers 12 and 13 thus formed are dried so as to evaporate the organic solvent, followed by heating the adhesive layers so as to cure the adhesive layers substantially completely, i.e., to cure up to the C-stage. In general, the dried adhesive layers are heated to 120° to 190° for 15 minutes to one hour for the curing treatment, though the curing condition differs depending on the kind of the thermosetting resin contained in the adhesive composition.

Figure 1B:
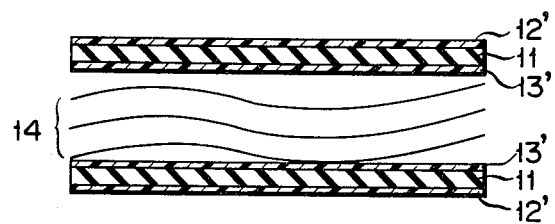
Figure 1C:
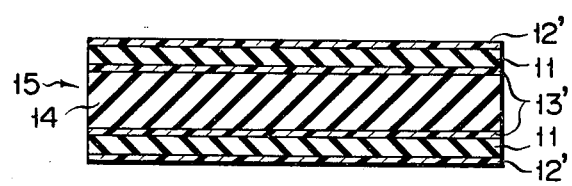

As shown in FIG. 1B, insulating sheets 11 each bearing cured adhesive layers 12' and 13' are superposed on both surfaces of a base material 14, followed by compressing the superposed structure under heat so as to produce a laminate 15 as shown in FIG. 1C. It is possible to use as the base material 14 a laminate consisting of a plurality of semi-cured pre-pregs each prepared by impregnating a subsrate such as a glass cloth with a thermosetting resin such as phenolic resin, unsaturated polyester or epoxy regin. In this case, it is possible to obtain the laminate 15 by heating under pressure the superposed structure consisting of the base material 14 and the insulating sheet 11 bearing the cured adhesive layers 12' and 13'. It is also possible to use as the base material 14 a ceramic plate, a metal plate, a thermoplastic resin plate or a thermoset resin plate. In this case, a proper adhesive such as a pressure-sensitive adhesive or an epoxy resin type adhesive is used for bonding the cured adhesive-bearing sheet 11 to the base material 14 so as to obtain the desired laminate 15.

It is desirable to coarsen the surfaces of the cured adhesive layers 12' and 13' which are to be brought into direct contact the base material 14. The coarsening treatment permits improving the bonding strength of the cured adhesive layer to the base material and also permits producing a laminate with a further improved heat resistance. Various coarsening treatments can be employed in this invention including, for example, a mechanical treatment such as a dry or liquid honing treatment in which an abrasive powder itself or a slurry thereof is blown against the cured adhesive surface; a discharge treatment utilizing glow discharge, corona discharge, etc.; and a physical or chemical treatment utilizing an oxidizing agent such as chromic acid, dichromic acid, sulfuric acid, permanganic acid or a mixture thereof. It is desirable to use as the oxidizing agent a mixture of chromic acid and sulfuric acid having a specific gravity of 1.4 to 1.75 under a temperature falling within the range of between room temperature and 100° C.

The coarsening treatment described above is also applied to the exposed surface of the cured adhesive layer 12' so as to improve the bonding strength of a chemical plating layer formed later to the layer 12'. It is desirable to control the coarsening treatment in a manner to permit a surface coarseness of about 0.5 to 10μ.

It is important to note that, in this invention, the adhesive layer is cured substantially completely inadvance as described previously. Thus, the components of the base material included in the laminate are prevented from being diffused into the adhesive layer in the subsequent heating step under pressure, leading to an excellent heat resistance of the laminate. Also, the cured adhesive layer has a coarse surface, leading to a high bonding strength between the adhesive layer and the base material. Further, the outermost surface of the laminate, i.e., the exposed surface of the cured adhesive layer, also has a reasonable coarseness. Thus, the metal layer formed later by means of chemical plating is strongly bonded to the cured adhesive layer.

Figure 2A:
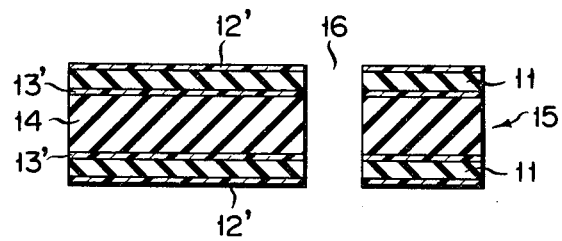
FIGS. 2A and 2B are cross sectional views collectively showing how to apply a chemical plating to the laminate produced by the method of this invention.
Figure 2B:
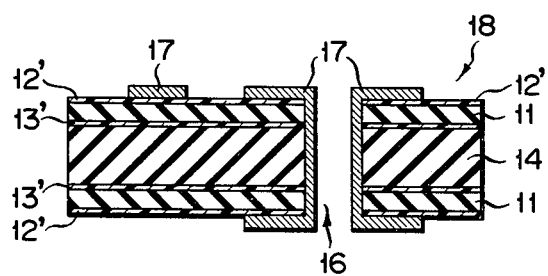

A chemical plating can be applied to the laminate without removing the insulating sheet. For example, a through hole 16 is made in the laminate 15 in preparation for the chemical plating operation as shown in FIG. 2A. Then, prescribed surface regions of the cured adhesive layers 12' and the wall defining the through hole 16 are treated with an activating agent such as palladium chloride or stannous chloride, followed by applying an ordinary chemical plating, e.g., chemical nickel or copper plating, to the laminate, using sodium hypophosphite, etc. as a reducing agent. The plating bath and plating condition for the chemical plating, or electroless plating are well known in the art. For example, it is possible to use the chemical copper plating bath described in "J. Electrochem. Soc.: Electrochemical Science and Tech. Vol. 123, No. 4 (1976), page 475, left column (Y. Okinaka and S. Nakahara)". It is also possible to use Electroless type of CIRCUBOND process by Shipley Co. (U.S.A.). After the chemical plating operation, a metal layer 17 is selectively formed as desired as shown in FIG. 2B. Incidentally, the metal layer 17 can be thickened, if necessary, by applying an electrolytic plating later.

The method of this invention produces additional merits as summarized in the following:

(1) Since an adhesive layer is formed on an insulating sheet, the adhesive coating operation can be performed continuously by using a supply roll and a take-up roll of the sheet, leading to an efficient coating operation.

(2) Since the adhesive layer formed on the insulating sheet is cured in advance, the adhesive-bearing sheet can be cut into pieces of desired size and shape for disposing the cut pieces on the desired portions alone of the base material.

(3) In the conventional method in which the base material is directly coated with an adhesive, the base material tends to be thermally deformed in the subsequent curing step of the adhesive. But, the thermal deformation does not take place in this invention because the adhesive layer formed on the insulating sheet is cured substantially completely in advance.

As described previously, a metal layer is formed by means of chemical plating on the surface of the laminate produced by the method of this invention. The metalized laminate thus produced provides a good ornamental article or electrical parts, particularly, a printed circuit board.

EXAMPLE 1

One surface of a polyimide sheet was coated with a varnish-like adhesive composition consisting of 40 parts by weight of butadiene-acrylonitrile rubber, 60 parts by weight of phenolic resin, and 500 parts by weight of methyl ethyl ketone (solvent), followed by heating the adhesive-bearing sheet for 1 hour at 180° C. so as to evaporate the solvent and cure substantially completely the adhesive layer. Then, the polyimide sheet bearing the cured adhesive layer was cut into pieces of proper size, and a piece of the cut sheet was laminated on a plurality of superposed pre-pregs each prepared by impregnating a glass fiber with epoxy resin. Of course, the polyimide sheet was laminated such that the cured adhesive layer was in direct contact with the pre-pregs. Under this condition, the laminated structure was heated at 170° C. for 45 minutes under a pressure of 30 kg/cm$^2$ so as to obtain a laminate. Further, the laminate was treated at 50° C. for 7 minutes with a chromic acid-sulfuric acid mixture having a specific gravity of 1.7 so as to coarsen the polyimide sheet surface.

Finally, an ordinary chemical copper plating was applied to the laminate treated with the acid mixture so as to produce a printed circuit board excellent in dielectric strength and insulating property. A peeling test was applied to the formed copper plating layer by the method specified in JIS C-6481, with the result that the peeling strength of the copper layer was 2.1 kg/cm. The copper layer was also found to exhibit a solder dip resistance of 180 sec/260° C.

EXAMPLE 2

Cured adhesive layers were formed as in Example 1 on both surfaces of a cotton paper sheet. On the other hand, both surfaces of a polycarbonate sheet were uniformly coated with a solventless non-cured epoxy resin, followed by laminating the cured adhesive-bearing paper sheets on both sides of the polycarbonate sheet. Under this condition, the laminated structure was heated at 80° C. for 30 minutes under a pressure of 1 kg/cm$^2$ so as to obtain a laminate. Further, the laminate was treated with a mixture consisting of a high concentration of chromic acid and sulfuric acid so as to coarsen the outermost surfaces of the cured adhesive layers included in the laminate.

Finally, an ordinary chemical nickel plating and, then, electrolytic copper plating were applied to the laminate treated with the acid mixture so as to produce a printed circuit board. The plating layer thus formed was found to exhibit a peeling strength of 1.7 kg/cm. Also, a thermal shock test was applied to the printed circuit board by the method specified in JIS C-1052, with the result that no swelling or peeling of the plating layer was recognized after 500 heating-cooling cycles.

EXAMPLE 3

Cured adhesive layers were formed as in Example 1 on both surfaces of a polyester sheet. On the other hand, a plurality, i.e., 5 to 10, of cotton paper sheets each coated with epoxy resin were superposed one upon the other so as to prepare a base material. The cured adhesive-bearing polyester sheet prepared first was laminated on the surface of the base material. Under this condition, the laminated structure was heated at 160° C. for 1 hour under a pressure of 120 kg/cm$^2$ so as to obtain a laminate. Then, the laminate was passed at a speed of 10 m/min through the clearance between a pair of electrodes disposed 2.4 mm apart from each other. Since an A.C. voltage of 8 kV with a frequency of 9 kHz was applied to the electrodes, the laminate was subjected to a glow discharge treatment for the outermost surface to be coarsened.

Finally, an ordinary chemical copper plating and, then, electrolytic copper plating were applied to the laminate bearing the coarsened surface so as to produce a printed circuit board excellent in dielectric strength and insulating property. The copper plating layer thus formed was found to exhibit a peeling strength of 1.6 kg/cm and a solder dip resistance of 80 sec/250° C.

EXAMPLE 4

Cured adhesive layers were formed as in Example 2 on both surfaces of a polyester unwoven fabric. On the other hand, both surfaces of an iron plate were coated with a solventless epoxy resin. The cured adhesive-bearing unwoven fabrics prepared first were laminated on both surfaces of the epoxy resin-bearing iron plate. Further, a fluoroplastic sheet was disposed on the surface of each of the unwoven fabrics so as to prevent the unwoven fabrics from being stained. Under this condition, the laminated structure was heated at 80° C. for 30 minutes under a pressure of 3 kg/cm$^2$, followed by removing the fluoroplastic sheets so as to expose the cured adhesive layers. Further, the resultant laminate was treated with a mixture consisting of a high concentration of chromic acid and sulfuric acid so as to coarsen the exposed surfaces of the cured adhesive layers.

Finally, an ordinary chemical copper plating and, then, electrolytic nickel plating were applied to the laminate. The resultant laminate with the metalized surface was found to be substantially equal in properties to those produced in Examples 1 to 3.

EXAMPLE 5

One surface of a polyimide sheet was coated with a varnish-like adhesive composition consisting of 40 parts by weight of butadiene-acrylonitrile rubber, 60 parts by weight of phenolic resin and 500 parts by weight of methyl ethyl ketone (solvent), followed by heating the sheet at 180° C. for 1 hour so as to evaporate the solvent and cure the adhesive completely. Then, the cured adhesive-bearing sheet was treated with a chromic acid-sulfuric acid mixture having a specific gravity of 1.7 for 7 minutes at 50° C. so as to coarsen the surface of the cured adhesive layer. The sheet treated with the acid mixture was cut into pieces of proper size and a piece of the cut sheet was laminated on a plurality of superposed pre-pregs each prepared by impregnating a glass fiber with epoxy resin. Of course, the cured adhesive-bearing sheet was laminated such that the cured adhesive layer was in direct contact with the outermost pre-preg. Under this condition, the laminated structure was heated at 170° C. for 45 minutes under a pressure of 30 kg/cm$^2$, followed by coarsening the exposed surface of the resultant laminate by means of the acid mixture treatment mentioned above.

Finally, an ordinary chemical copper plating was applied to the laminate so as to produce a printed circuit board excellent in dielectric strength and insulating property. A peeling test was applied to the formed copper plating layer by the method specified in JIS C-6481, with the result that the peeling strength of the copper layer was 2.1 kg/cm. Also, the copper layer was found to exhibit a solder dip resistance of 180 sec/260° C.

EXAMPLE 6

Cured adhesive layers with coarsened surfaces were formed as in Example 5 on both surfaces of a cotton paper sheet. On the other hand, both surfaces of a polycarbonate sheet were uniformly coated with a solventless non-cured epoxy resin. Then, the cotton paper sheets were laminated on both surfaces of the polycarbonate sheet. Under this condition, the laminated structure was heated at 80° C. for 30 minutes under a pressure of 1 kg/cm$^2$, followed by coarsening the exposed surfaces of the resultant laminate as in Example 5.

Finally, an ordinary chemical nickel plating and, then, electrolytic copper plating were applied to the laminate so as to obtain a printed circuit board. The plating layer formed was found to exhibit a peeling strength of 1.7 kg/cm. Also, a thermal shock test was applied to the printed circuit board by the method specified in JIS C-1052, with the result that no swelling or peeling of the plating layer was recognized after 500 heating-cooling cycles.

EXAMPLE 7

Cured adhesive layers were formed as in Example 5 on both surfaces of a polyester sheet. Then, the cured adhesive-bearing sheet was passed at a speed of 10 m/min through the clearance between a pair of electrodes disposed 2.4 mm apart from each other. Since an A.C. voltage of 8 kV with a frequency of 9 kHz was applied to the electrodes, the outer surfaces of the cured adhesive layers were subjected to a glow discharge treatment and, thus, coarsened. On the other hand, a plurality, i.e., 5 to 10, of cotton paper sheets each coated with epoxy resin were superposed one upon the other so as to prepare a base material. Then, the polyester sheet bearing the cured adhesive layers with the coarsened surfaces was laminated on the base material. The laminated structure was heated at 160° C. for 1 hour under a pressure of 120 kg/cm$^2$, followed by coarsening the exposed surface of the resultant laminate as in Example 5.

Finally, an ordinary chemical copper plating and, then, electrolytic copper plating were applied to the laminate so as to produce a printed circuit board excellent in dielectric strength and insulating property. The copper plating layer of the printed circuit board was found to exhibit a peeling strength of 1.6 kg/cm and a solder dip resistance of 80 sec/250° C.

EXAMPLE 8

A cured adhesive layer with a coarsened surface was formed as in Example 6 on the surface of a polyester unwoven fabric. On the other hand, both surfaces of an iron sheet were coated with a solventless epoxy resin. The adhesive-bearing fabrics were disposed on both sides of the resin-coated iron sheet and a fluoroplastic sheet was further disposed on the surface of the laminated structure for preventing the surface of the laminated structure from being stained. Under this condition, the laminated structure was heated at 80° C. for 30 minutes under a pressure of 3 kg/cm$^2$, followed by removing the fluoroplastic sheet. Further, the exposed surface of the resultant laminate was coarsened as in Example 5 so as to obtain a desired laminate.

Finally, an ordinary chemical copper plating and, then, electrolytic nickel plating were applied to the laminate so as to obtain a laminate with a metalized surface substantially equal in properties to those obtained in Examples 5 to 7.

What we claim is:

1. A method of producing a laminate to the surface of which a chemical plating is to be applied, comprising the steps of:
   (a) forming a thermosetting adhesive layer containing a butadiene-based rubber on at least one surface of a peel-resistant insulating sheet;
   (b) curing the adhesive layer substantially completely;
   (c) coarsening the surface of the cured adhesive layer;
   (d) laminating the adhesive-bearing sheet on a base material such that the cured adhesive layer is bonded to the base material layer; and
   (e) coarsening the outermost surface of the laminate on the side of the insulating sheet.

2. The method according to claim 1 wherein the adhesive layer contains 20 to 70% by weight of the butadiene-based rubber.

3. The method according to claim 2, wherein the base material consists of a plurality of superposed pre-pregs and the laminated structure consisting of the base material and the cured adhesive-bearing insulating sheet is heated under pressure so as to produce the desired laminate.

4. The method according to claim 2, wherein the base material is a thermoplastic resin plate, a ceramic plate or a metal plate, and the cured adhesive-bearing sheet is bonded to the base material using an adhesive so as to produce the desired laminate.

5. The method according to claim 1, wherein the coarsening treatment is performed mechanically.

6. The method according to claim 1, wherein the coarsening is performing by utilizing discharge treatment.

7. The method according to claim 1, wherein the coarsening treatment is performed by utilizing an oxidizing agent.

8. The method according to claim 7, wherein the oxidizing agent is a chromic acid-sulfuric acid mixture having a specific gravity of 1.4 to 1.75.

9. The method according to claim 1, wherein the adhesive layers are formed on both surfaces of the insulating sheet.

10. A method of producing a laminate with a metalized surface comprising the steps of:
    (a) forming a thermosetting adhesive layer containing a butadiene-based rubber on at least one surface of a peel-resistant insulating sheet;
    (b) curing the adhesive layer substantially completely;
    (c) coarsening the surface of the cured adhesive layer;
    (d) laminating the insulating sheet on a base material such that the coarsened surface of the cured adhesive layer is bonded to the base material;
    (e) coarsening the outermost surface of the laminate on the side of the insulating sheet; and
    (f) applying a chemical plating to the coarsened outermost surface of the laminate.

11. The method according to claim 10, wherein the adhesive layer contains 20 to 70% by weight of the butadiene-based rubber.

12. The method according to claim 11, wherein the base material consists of a plurality of superposed pre-pregs and the laminated structure consisting of the base material and the cured adhesive-bearing sheet is heated under pressure so as to provide the laminate.

13. The method according to claim 11, wherein the base material is a thermoplastic resin sheet, a ceramic sheet or a metal sheet, and the cured adhesive-bearing sheet is bonded to the base material using an adhesive so as to provide the laminate.

14. The method according to claim 10, wherein the coarsening treatment is performed mechanically.

15. The method according to claim 10, wherein the coarsening is performed by utilizing discharge treatment.

16. The method according to claim 10, wherein the coarsening treatment is performed by utilizing an oxidizing agent.

17. The method according to claim 16, wherein the oxidizing agent is a chromic acid-sulfuric acid mixture having a specific gravity of 1.4 to 1.75.

18. The method according to claim 10, wherein the adhesive layers are formed on both surfaces of the insulating sheet.

19. The method according to claim 18, wherein the laminate is provided with a through hole.

20. The method of claim 1 or 10, wherein said peel-resistant insulating sheet comprises a heat resistant plastic sheet, a paper sheet or a synthetic fiber cloth.

21. The method of claim 20, wherein said peel-resistant insulating sheet is a heat resistant plastic sheet.

22. The method of claim 1 or 10, wherein said cured adhesive layer has a thickness of 20 to 100 microns.

23. The method of claim 1 or 10, wherein said coarsened surface of the adhesive layer has a surface coarseness of about 0.5 to 10 microns.

24. The method of claim 1 or 10, wherein said outermost surface of the laminant of step (e) has a surface coarseness of about 0.5 to 10 microns.

* * * * *